United States Patent [19]

Buzzard et al.

[11] 4,069,970

[45] Jan. 24, 1978

[54] DATA ACCESS CIRCUIT FOR A MEMORY ARRAY

[75] Inventors: Clair Alan Buzzard, Lincroft; Richard Cyril Gifford, Holmdel; Frank William Lescinsky, Middletown; Robert Michael Zachok, Toms River, all of N.J.

[73] Assignee: Bell Telephone Laboratories, Incorporated, Murray Hill, N.J.

[21] Appl. No.: 699,423

[22] Filed: June 24, 1976

[51] Int. Cl.$^2$ .................. G11C 29/00; G06F 11/10
[52] U.S. Cl. .................. 235/312; 179/1 SM; 364/900
[58] Field of Search ............ 235/153 AM; 179/1 SM, 179/1 SA; 340/148, 146.1 AX, 172.5, 146.1 AG; 364/200, 900

[56] References Cited

U.S. PATENT DOCUMENTS

| | | | |
|---|---|---|---|
| 2,904,781 | 9/1959 | Katz | 235/153 AM |
| 3,398,241 | 8/1968 | Lee | 179/1 SM |
| 3,641,496 | 2/1972 | Slavin | 340/148 |
| 3,652,998 | 3/1972 | Forney, Jr. | 340/146.1 A |
| 3,789,204 | 1/1974 | Barlow | 235/153 AM |
| 3,898,443 | 8/1975 | Smith | 235/153 AM |

*Primary Examiner*—Charles E. Atkinson

*Attorney, Agent, or Firm*—Roy C. Lipton

[57] ABSTRACT

A memory array, having a plurality of intersecting rows and columns, stores digitized speech. Each row and column intersection consists of a binary storage cell for storing one bit of digitized speech. Incoming digitized speech is loaded into columns of the memory array in a plurality of repetitive loading sequences, each loading sequence including: reading out the bits stored in successive rows of binary storage cells, replacing in each successive row of bits, a predetermined one of the bits in the read out row with a successive one of the bits of the digitized speech and writing each read out row of bits including the replaced bit back into the row. Multibit binary grunts (digitized speech segments) stored in the array are read out therefrom by applying the bits of the grunts to time slots in frames on a time-division highway, each frame being of n bits duration and including one bit from each of n grunts stored in the array. A selected grunt is extracted from the highway by commencing a count of the bits on the highway with a first bit of the selected grunt and by extracting the first bit and every $n^{th}$ bit thereafter. Memory malfunction is indicated when the number of rows in the array containing parity errors exceeds a predetermined threshold number.

15 Claims, 12 Drawing Figures

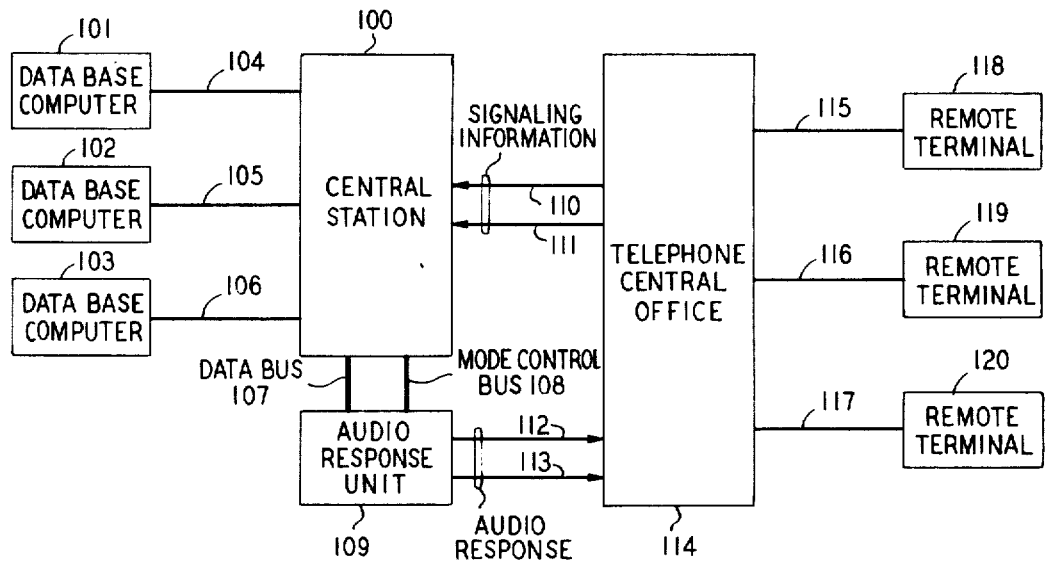
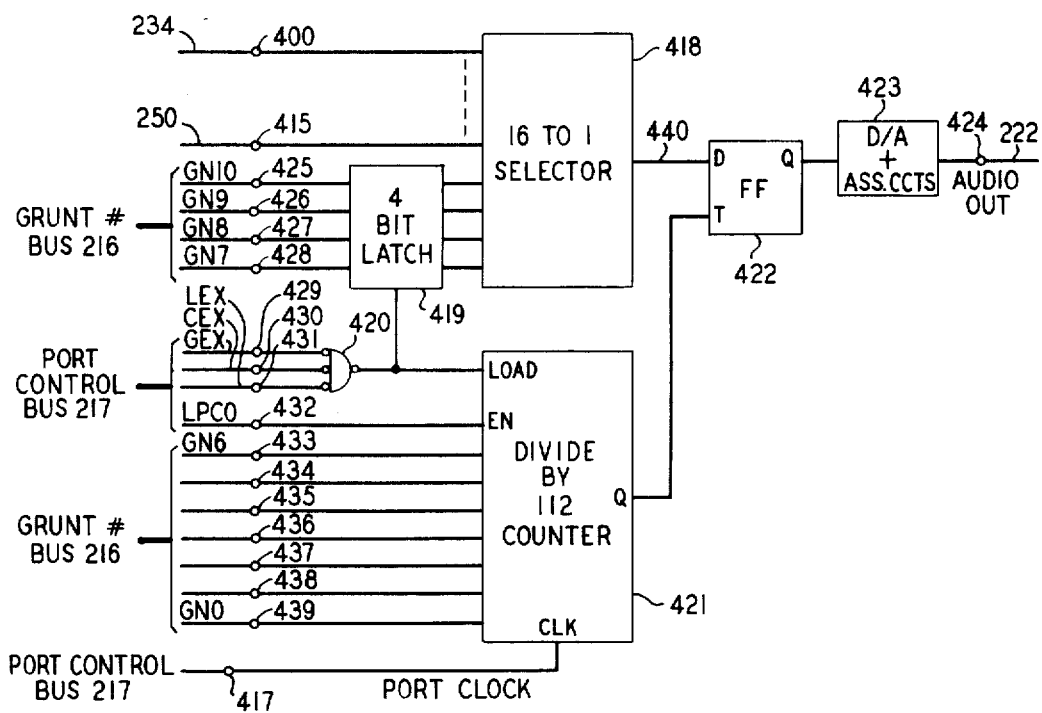

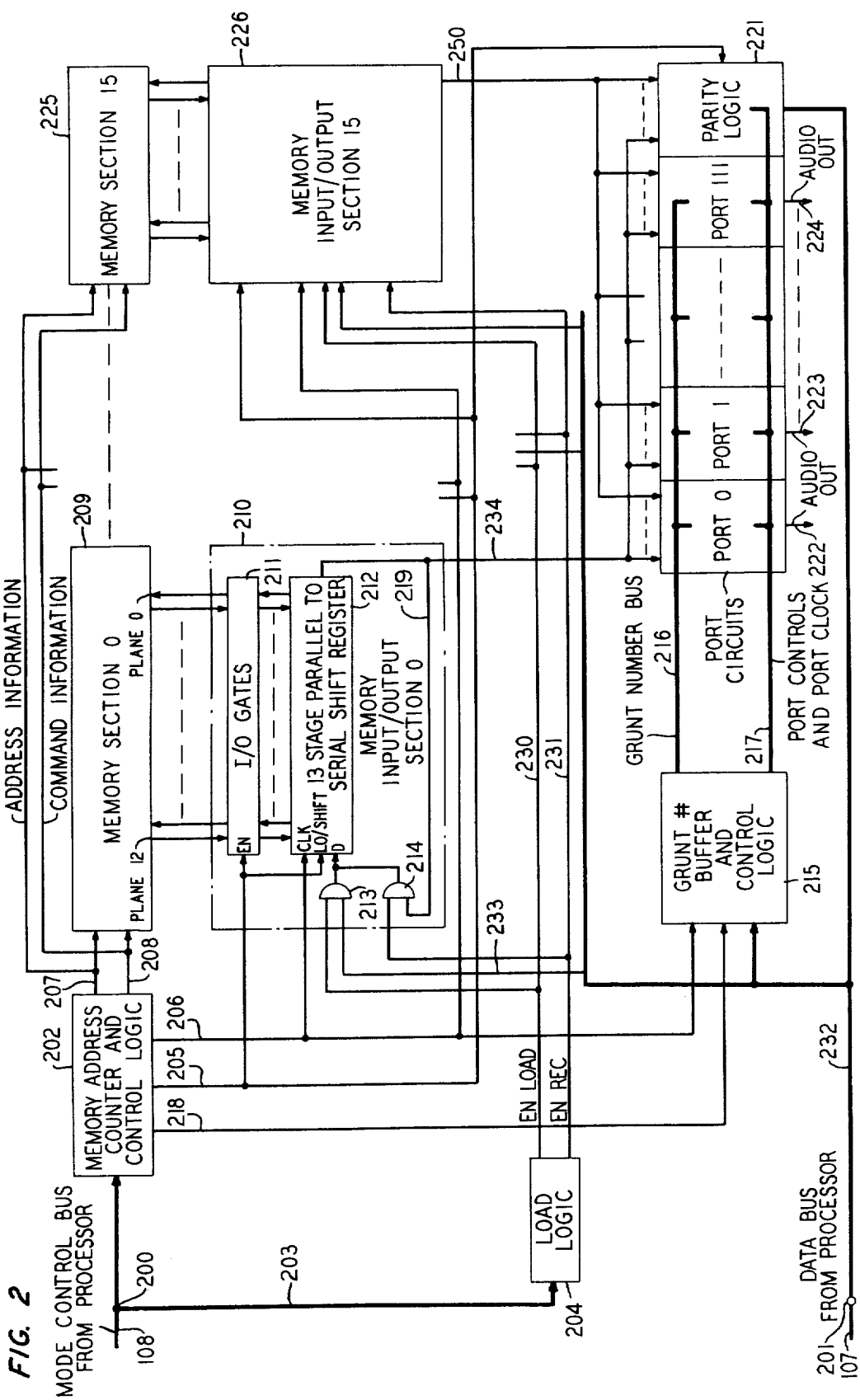

FIG. 3A

| | | | | |
|---|---|---|---|---|
| SHELF 0 | SECTION 0<br>13 MEMORY PLANES<br>32K BITS/PLANE<br>8 GRUNTS OF 4K BITS | SECTION 1 | SECTION 2 | SECTION 3 |
| SHELF 1 | SECTION 4 | SECTION 5 | SECTION 6 | SECTION 7 |
| SHELF 2 | SECTION 8 | SECTION 9 | SECTION 10 | SECTION 11 |
| SHELF 3 | SECTION 12 | SECTION 13 | SECTION 14 | SECTION 15 |

FIG. 3B
MEMORY ORGANIZATION

| | PLANE 12 | PLANE 11 | | PLANE 1 | PLANE 0 |
|---|---|---|---|---|---|
| ADDR 32767 | GR 103 BIT 4095 | GR 95 BIT 4095 | | GR 15 BIT 4095 | GR 7 BIT 4095 |
| ADDR 32766 | GR 102 BIT 4095 | GR 94 BIT 4095 | | GR 14 BIT 4095 | GR 6 BIT 4095 |
| ADDR 32765 | GR 101 BIT 4095 | GR 93 BIT 4095 | | GR 13 BIT 4095 | GR 5 BIT 4095 |
| ADDR 32764 | GR 100 BIT 4095 | GR 92 BIT 4095 | | GR 12 BIT 4095 | GR 4 BIT 4095 |
| ADDR 32763 | GR 99 BIT 4095 | GR 91 BIT 4095 | | GR 11 BIT 4095 | GR 3 BIT 4095 |
| ADDR 32762 | GR 98 BIT 4095 | GR 90 BIT 4095 | | GR 10 BIT 4095 | GR 2 BIT 4095 |
| ADDR 32761 | GR 97 BIT 4095 | GR 89 BIT 4095 | | GR 9 BIT 4095 | GR 1 BIT 4095 |
| ADDR 32760 | GR 96 BIT 4095 | GR 88 BIT 4095 | | GR 8 BIT 4095 | GR 0 BIT 4095 |
| ⋮ | ⋮ | ⋮ | | ⋮ | ⋮ |
| ADDR 9 | GR 97 BIT 1 | GR 89 BIT 1 | | GR 9 BIT 1 | GR 1 BIT 1 |
| ADDR 8 | GR 96 BIT 1 | GR 88 BIT 1 | | GR 8 BIT 1 | GR 0 BIT 1 |
| ADDR 7 | GR 103 BIT 0 | GR 95 BIT 0 | | GR 15 BIT 0 | GR 7 BIT 0 |
| ADDR 6 | GR 102 BIT 0 | GR 94 BIT 0 | | GR 14 BIT 0 | GR 6 BIT 0 |
| ADDR 5 | GR 101 BIT 0 | GR 93 BIT 0 | | GR 13 BIT 0 | GR 5 BIT 0 |
| ADDR 4 | GR 100 BIT 0 | GR 92 BIT 0 | | GR 12 BIT 0 | GR 4 BIT 0 |
| ADDR 3 | GR 99 BIT 0 | GR 91 BIT 0 | | GR 11 BIT 0 | GR 3 BIT 0 |
| ADDR 2 | GR 98 BIT 0 | GR 90 BIT 0 | | GR 10 BIT 0 | GR 2 BIT 0 |
| ADDR 1 | GR 97 BIT 0 | GR 89 BIT 0 | | GR 9 BIT 0 | GR 1 BIT 0 |
| ADDR 0 | GR 96 BIT 0 | GR 88 BIT 0 | | GR 8 BIT 0 | GR 0 BIT 0 |

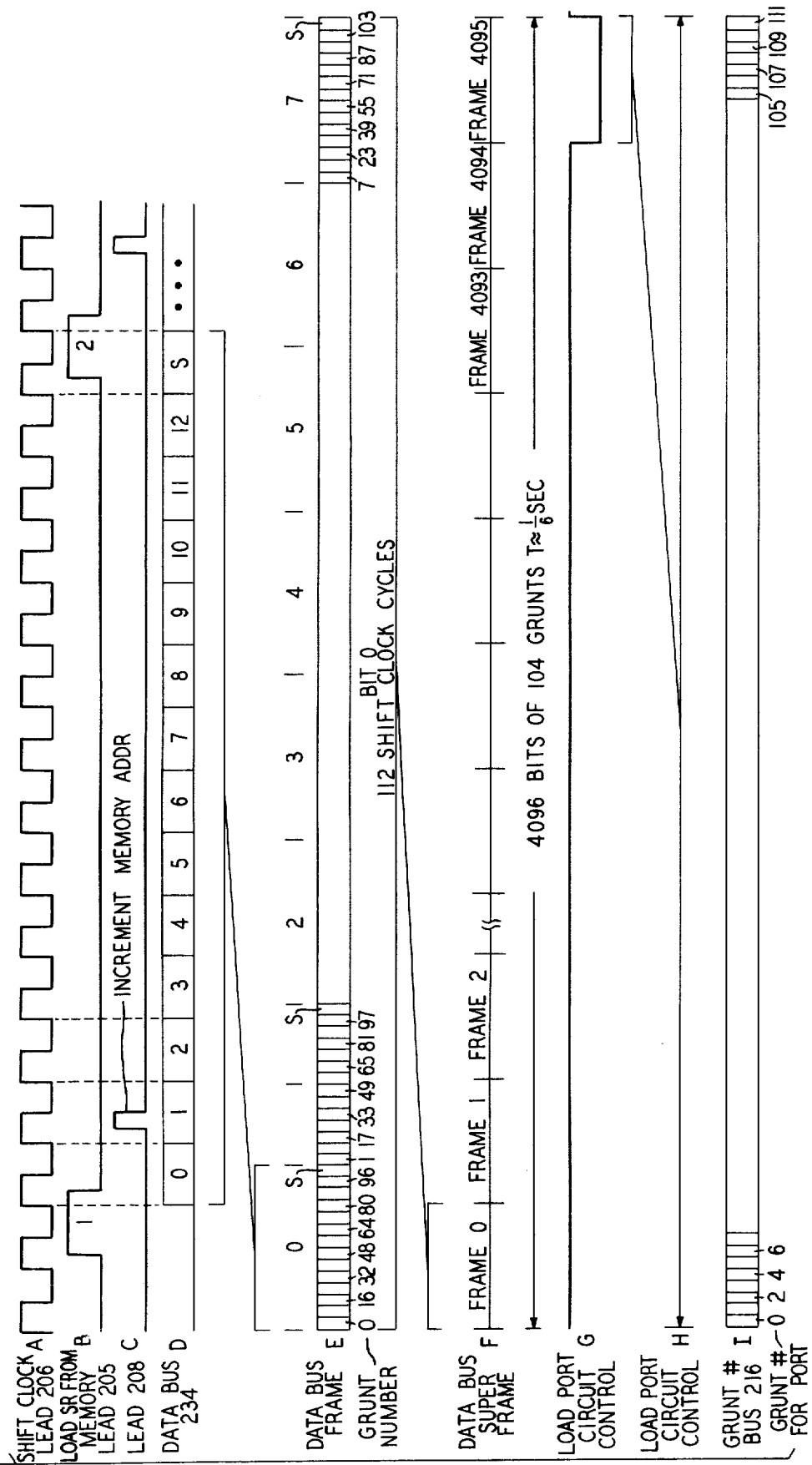

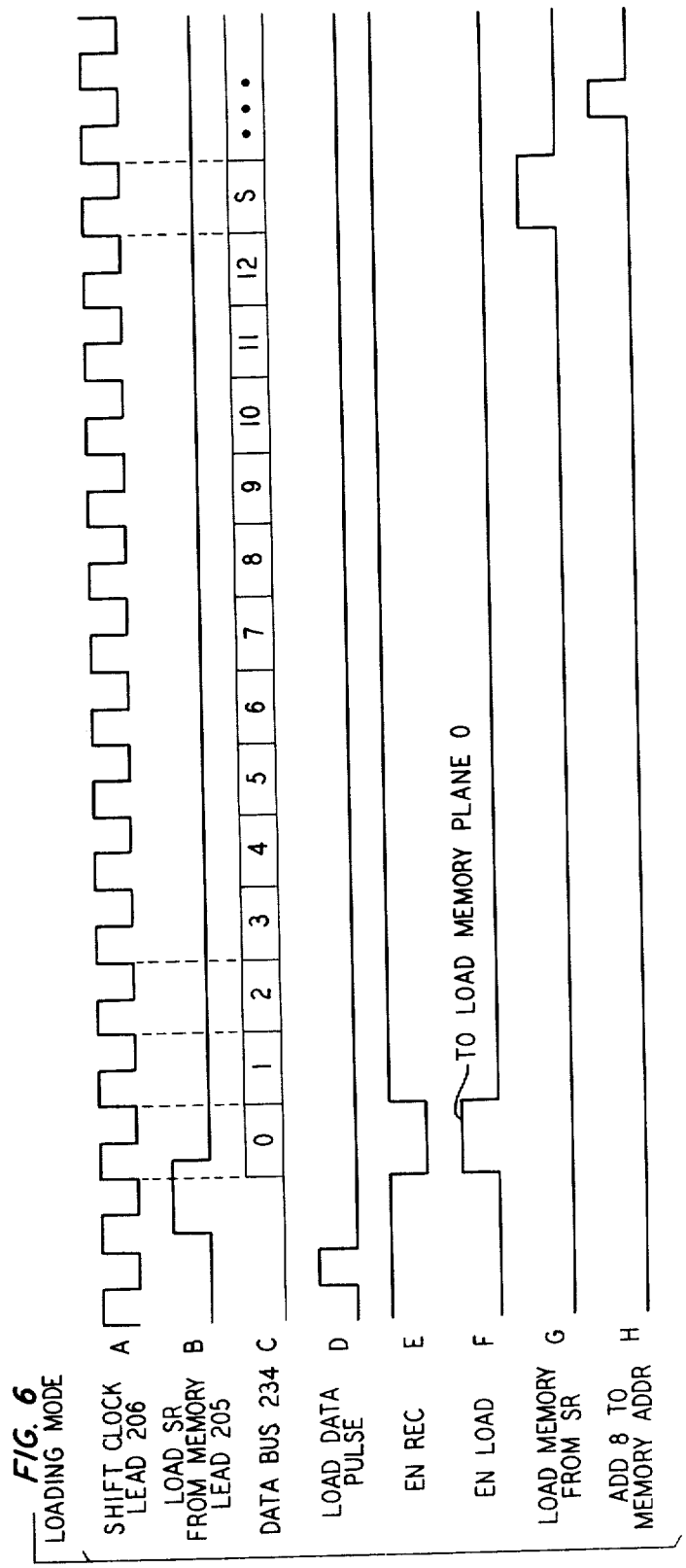

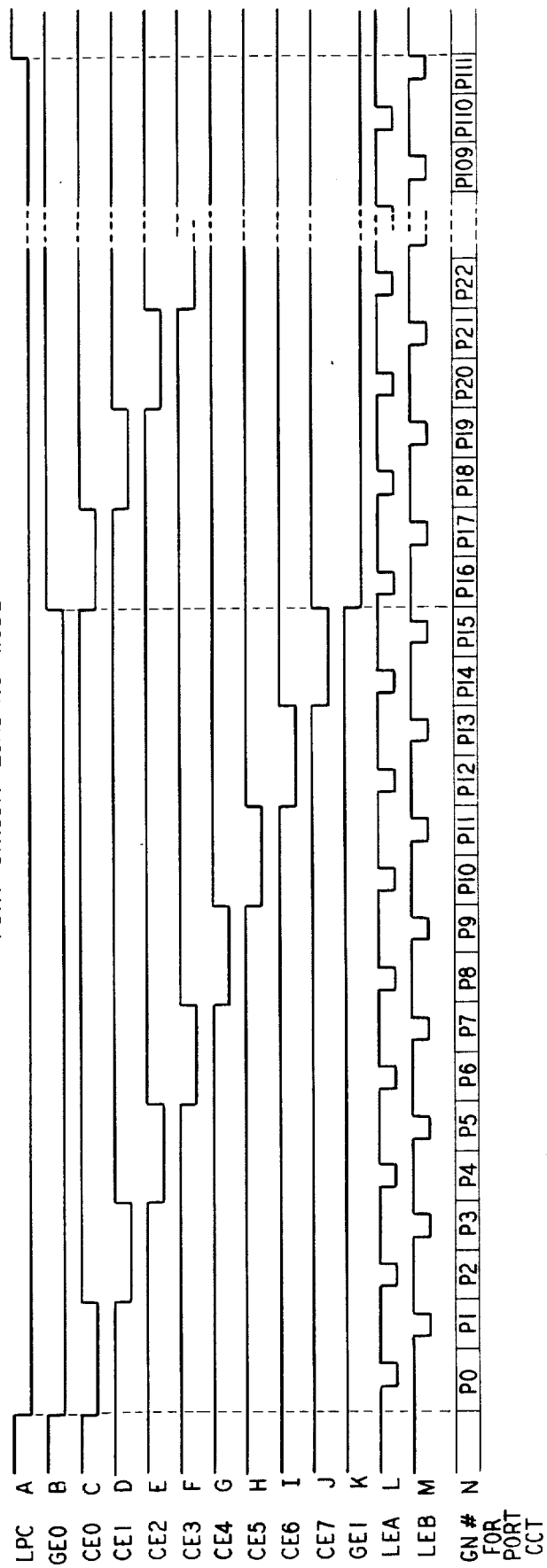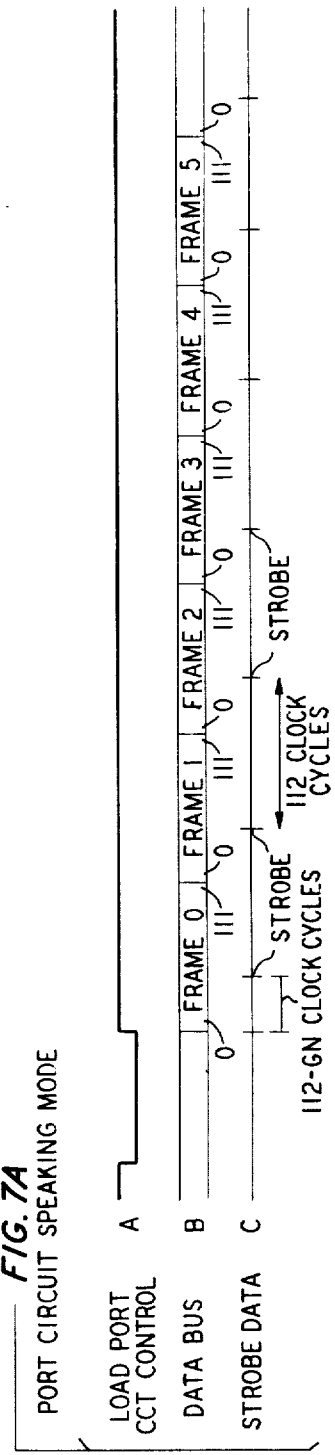

DATA ACCESS CIRCUIT FOR A MEMORY ARRAY

FIELD OF THE INVENTION

This invention relates to audio response units, and more particularly, to memory arrays utilized in audio response units for the storage of digitized speech.

DESCRIPTION OF THE PRIOR ART

The expanding use of computers has resulted in an acute need to simplify and improve the communications link between man and machine. Progress towards achieving better communications between man and machine has been made in the area of audio response units. These units, under the control of an associated computer, store human speech, either in analog or digital form, and respond to information requests to the computer by compiling an audio response which is forwarded to the human inquirer. Responding in this manner to a human request eliminates the need for teletypewriter terminals, CRT screens and similar terminal apparatus and presents the requested information to the user in a form with which the human user is most familiar.

Widespread use of audio response units is contingent upon the storage of a large vocabulary of words or phrases. This was accomplished in the prior art by storing individual words or phrases in analog form on a magnetic drum and then selecting certain of these words or phrases to form complete sentences. It was discovered that a more efficient means of storing speech was to digitize it before storage. Towards this end, prior art systems have been developed in which analog speech is digitized by applying the speech to an analog-to-digital converter by dividing the digitized speech into segments called grunts, which are generally shorter than most words, and by storing the grunts on magnetic drums, discs or tapes. The grunts are then retrieved from storage in a predetermined sequence and applied to a digital-to-analog converter to form analog words and sentences.

The use of magnetic drums, discs or tape to store digitized speech presents a number of difficulties due to their weight, size and maintenance limitations. In an attempt to eliminate these difficulties, it has been found that solid state storage is an advantageous medium for storing digitized speech in that it is of minimum size and weight, has no moving parts and can generally be readily adapted to even the most extreme environments. Various types of solid state storage are known in the art, such as Random Access Memories (RAM) and Read Only Memories (ROM). Digital information stored in a ROM is inserted therein during fabrication and is not thereafter readily alterable. Digital information stored in a RAM, however, is addressable, and can be readily changed when necessary. Therefore, it is advantageous to use a RAM in audio response units when the stored vocabulary must be frequently changed.

The ability to frequently change the vocabulary of an audio response unit is important in many applications and therefore the technique of loading new digital information into a RAM is an essential element in increasing the usefulness of an audio response unit. RAMs are generally arranged as a matrix array with a predetermined number of intersecting rows and columns. Each row and column intersection comprises a storage cell which stores one bit of digitized speech. Conventionally, the number of cells in each row of a memory array is limited to an amount which is fewer in number than the number of bits in a grunt. It is thus advantageous to store grunts in columns of the memory array.

Storing a grunt in a column of the memory array cannot be accomplished directly as conventional RAMs are addressable on a row-by-row basis. The prior art solves this problem by interleaving the bits of a plurality of the incoming grunts so that loading the memory array one row at a time results in storing each of the grunts in one of the columns of the memory array. More particularly, the computer associated with the memory divides a stream of digitized speech into grunts, and interleaves the bits of the various grunts to form a serial data stream. The serial data stream is divided into portions, with each portion consisting of a number of bits equal to the number of storage positions in one row of the RAM. The first portion of the data stream is comprised of all the first bits from a number of different grunts equal in number to the number of columns in the memory array. The second portion is comprised of all the second bits from the same grunts, the third portion is comprised of all the third bits, etc. Successive portions are shifted in series into a serial to parallel converter and then written in parallel into successive rows of the RAM. Each bit in each portion is associated with a particular column of the array such that loading the portions in parallel into successive rows of the array results in storing each grunt in a particular column of the array.

The above type of loading technique presents problems when a particular data stream portion being clocked into the serial to parallel converter gains or loses a clock transfer pulse. This results in shifting the entire stream of multibit portions one position left or right such that the bits of all subsequent portions clocked into the serial to parallel converter will also be shifted. Thus, the bits of all portions subsequent to the error will be written into a memory column which is one position left or right from the column in which the bit belongs. Therefore the occurrence of one clock error during loading will result in each bit in all grunts subsequent to the error being stored in an incorrect column in the memory. This problem, known as "memory streaking" in the prior art, requires a reload of the entire memory each time it occurs. From the foregoing, it is clear that the prior art method of loading results in catastrophic failure upon the happenstance of a simple clock error. This susceptibility to failure is a direct result of the fact that the prior art method of loading must interleave the bits of the incoming grunts in order to load the grunts in the columns of the memory array.

It is therefore an object of this invention to improve the technique of loading digitized speech into a memory array.

Once digitized speech has been loaded into a RAM without the occurrence of errors, it is essential that a maintenance scheme be employed to periodically check the sanity of the memory. Prior art maintenance schemes normally consist of the associated computer simply doing a parity check on each row of the RAM and indicating a memory malfunction each time a parity error is found. This procedure although accurate requires a substantial amount of computer time.

It is therefore another object of the invention to minimize the computer time required to determine memory sanity.

An additional area of concern in the utilization of a solid state memory to store digitized speech is the reading out of the stored grunts from the memory to form audio speech messages. In the prior art each row in the array is read out and the bits from each row are distributed to time slots in frames on a high speed time-division highway. The stream of data on the time-division highway is routed past a number of port circuits. Each port circuit is provided with time slot addresses by the associated computer which define time slot positions in the data stream containing the bits of the grunts to be read from the memory array. Each port circuit compares the time slot addresses with time slot positions and each time a comparison is detected, the port circuit extracts a bit from the highway and applies the extracted bit to a digital-to-analog converter thereby converting the binary grunts to analog speech. A plurality of port circuits can be connected to the time-division highway with each port circuit providing a separate audio output. This prior art scheme requires complex comparison circuits thereby rendering this scheme expensive and complicated.

It is therefore another object of the invention to simplify the manner in which digitized speech is read out from a memory array.

SUMMARY OF THE INVENTION

In accordance with one aspect of the invention, incoming digitized grunts are loaded into columns of the memory array one at a time rather than several grunts simultaneously.

It is a feature of the invention that the incoming grunts in the form of a string of successive bits are loaded into the memory array in a plurality of repetitive loading sequences, each loading sequence being associated with an individual column of the memory array and including reading out the bits stored in successive rows of the memory array, replacing in each successive row of bits, the bit from the associated column with a successive one of the bits in the string of bits and writing the read out row of bits, including the replaced bit, back into the row. Loading grunts one at a time into columns of the memory array solves the memory streaking problem inherent in the prior art, since a bit shift in the incoming stream due to the gain or loss of a clock transfer pulse simply results in the bits subsequent to the error being shifted up or down one position in the column. A shift up or down one position in the column results in one incorrect bit in the grunt stored in the column which is undetectable when the grunt is reconverted to audio speech. This is in contrast to the prior art in which a bit shift in the incoming data stream results in bit shifts to other columns and thus in catastrophic loading failure.

It is another feature of the invention that each read out row of bits is stored in a recirculating register, and the bit read out from the associated column is precluded from recirculating. The precluded bit is replaced and the read out row of bits and the replaced bit are written back into the row, whereby all bits except the precluded bit are written unchanged back into the row.

It is a further feature of the invention that, since a certain number of errors are acceptable in digitized speech without degrading the audio output, memory sanity is determined in accordance with the invention by counting the number of rows in the memory array in which parity errors occur and by indicating a memory malfunction when the number of rows containing parity errors exceed a predetermined threshold number. Indicating memory malfunction only when parity errors exceed a predetermined threshold minimizes the computer time necessary to determine memory sanity.

In accordance with another aspect of the invention the bits of grunts to be extracted from the memory array are distributed to time slots in frames on a time-division highway, each frame being of $n$ bits duration and including one bit from each of $n$ grunts stored in the memory array. It is another feature of the invention that a selected grunt is extracted from the highway by commencing a count of the bits on the time-division highway with a first bit of the selected grunt and by extracting the first bit and every $n^{th}$ bit thereafter.

The foregoing and other objects and features of this invention will be more fully understood from the following description of an illustrative embodiment thereof in conjunction with the accompanying drawings.

BRIEF DESCRIPTION OF THE DRAWINGS

In the drawings:

FIG. 1 discloses in block diagram form an inquiry/response communications system containing an audio response unit;

FIG. 2 discloses in block diagram form the components of the audio response unit;

FIGS. 3A and 3B disclose a functional representation of a memory array utilized in the audio response unit;

FIG. 4 discloses the details of a port circuit utilized in the audio response unit;

FIG. 5 discloses a timing diagram useful in understanding the manner in which information is extracted from the memory array;

FIG. 6 discloses a timing diagram useful in understanding the manner in which information is loaded into the memory array;

FIGS. 7 and 7A disclose a timing diagram for a port circuit;

DETAILED DESCRIPTION

Figure 8:
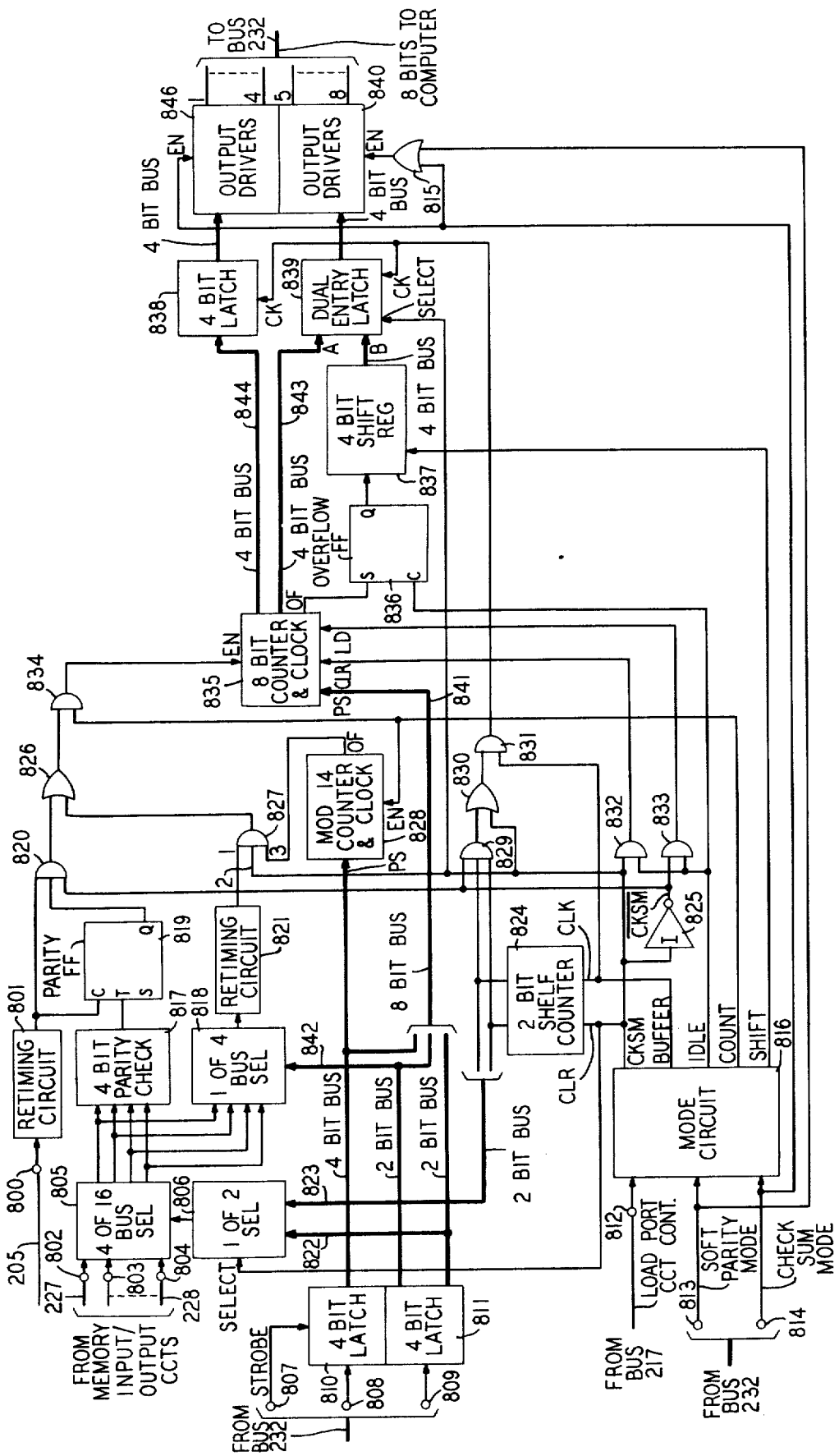
FIG. 8 discloses the details of a parity logic circuit utilized in the audio response unit.

Refer to FIG. 1. Therein is shown a block diagram representation of an inquiry/response communications system designed to provide communications between a plurality of remote terminals and a plurality of data base computers for the purposes of credit verification, point of sale transactions, electronic funds transfer, or other inquiry/response applications. Data base computers 101 through 103 could, for example, be general purpose computers located at a bank and would function to store credit information or other information of interest to a plurality of users. Remote terminals 118 through 120 could, for example, be standard TOUCH-TONE telephones or alternatively could be inquiry/response terminals of the type shown in U.S. Pat. No. 3,938,090 issued to V. S. Borison et al on Feb. 10, 1976. These remote terminals would be located on a merchant's premises or other location from which it is desired to access credit information or other information stored in the data base computers. Central station 100 functions to selectively connect any of the data base computers to any of the remote terminals in a manner to be detailed hereinafter and contains a general purpose computer and associated data communications equipment. Audio response unit 109 stores digitized speech messages in accordance with this invention and functions to transmit audio response messages to the remote terminals under the command of the general purpose computer located in the central station, as will be hereinafter described.

A remote terminal desiring to communicate with a data base computer places a DDD call via telephone lines 115, 116, or 117 and telephone central office 114 to central station 100. Subsequent to the completion of the DDD call, a remote terminal transmits signaling information via lines 115, 116 or 117, central office 114, and signaling paths 110 and 111 to the general purpose computer located in the central station. The signaling information is used to identify which data base computer the remote terminal wishes to communicate with. Central station 100, in response to the signaling information, connects signaling paths 110 and 111 to two-way signaling paths 104, 105 or 106 and completes a connection between the remote terminal and the designated data base computer. Subsequent thereto, the remote terminal transmits inquiries to the data base computer. In response thereto, the data base computer processes the inquiry and formulates a response, the response for example, being the credit status of a particular customer desiring to purchase an item at the merchant's premises where the remote terminal is located. This response is sent in digital format to central station 100 via signaling paths 104, 105 or 106, and informs the central station which type of audio reply should be returned to the remote terminal. The central station transmits commands to audio response unit 109 via buses 107 and 108 and instructs the audio response unit to retrieve a particular message from storage and transmit the message via paths 112 and 113 and central office 114 to the remote terminal which initiated the communication sequence.

Audio response unit 109 stores a plurality of audio response messages for transmission to the remote terminals. These messages are made up of sentences or phrases which are in turn made up of individual spoken words. Each word is comprised of speech segments called "grunts" which in general are shorter than a spoken word. These elementary speech segments are digitzed and stored in a Random Access Memory (RAM) included in audio response unit 109 for subsequent retrieval as will be described in detail hereinafter.

Refer to FIGS. 3A and 3B. FIG. 3A is a block diagram representation of the RAM used in audio response unit 109. The RAM is divided into 16 individual memory sections. Each memory section in turn is comprised of 13 memory planes and each memory plane contains 32,768 bits of binary storage. Each memory plane stores 8 grunts with each grunt occupying 4,096 bits of storage.

FIG. 3B shows a graphical representation of one of the memory sections in the RAM. Each memory section is organized in the same manner as is illustrated in FIG. 3B. The memory section shown in FIG. 3B is organized into a number of intersecting rows and columns. More particularly, each memory section contains 13 columns of storage labeled as memory planes 0 through 12, and each memory section contains 32,768 rows of storage labeled as addresses 0 through 32,767. Each memory plane therefore contains 32,768 storage positions and each row contains 13 storage positions with each storage position containing one bit of digitized speech. Each plane in the memory section contains 8 grunts with each grunt occupying 4,096 bits of storage. Plane 0, for example, contains grunts 0 through 7, plane 1 contains grunts 8 through 15, etc. with plane 11 containing grunts 88 through 95 and plane 12 containing grunts 96 through 103. Grunts are stored in each plane in ascending bit order. For example, positions 0 through 7 of plane 0 contains bit 0 from the 8 grunts stored in plane 0. Positions 8 through 15 of plane 0 contains bit 1 from the 8 grunts stored in plane 0, etc. with positions 32,760 through 32,767 of plane 0 containing bit 4,095 of the 8 grunts stored in plane 0. The remaining planes of the RAM are organized in an identical manner as is shown in FIG. 3B.

The information stored in each section of the RAM can be accessed on a row-by-row basis. For example, when address 0 is applied to a memory section, all the bits stored in row 0 are accessed, that being bit 0 of grunt 0, 8, 16, etc. up to grunt 96. Address 1 accesses bit 0 of grunts 1, 9, 17, etc. up to grunt 97. The remaining rows of each memory section are accessed as is shown in FIG. 3B.

FIGS. 3A and 3B illustrate a functional representation of a RAM emphasizing the matrix array arrangement. It is to be understood that such a RAM would require input and output circuitry, refresh circuitry, etc. to allow information to be entered into and extracted from the RAM. Such circuitry is well known in the art and is illustrated, for example, in "Enter the 16,384-bit RAM" by J. E. Coe and W. G. Oldham, *Electronics*, Feb. 19, 1976. In all subsequent references to the RAM, it is assumed that such circuitry is included in the block diagram representations of the RAM and functions to enter information into and extract information from the RAM in a manner which is well known in the art.

Refer to FIG. 2. Therein is shown the details of audio response unit 109. Incoming data bus 107 from the processor in central station 100 is applied to input terminal 201. This data bus carries information to be stored in the RAM and carries grunt number identification information as will be detailed hereinafter. Incoming mode control bus 108 from the processor in central station 100 is applied to input terminal 200 and carries command information for the audio response unit as will be described hereinafter. This command information is applied to logic 202 and logic 204. Logic 202 in response to the command information from central station 100 generates address and command information for the memory sections of the RAM and generates command information and a clock signal for the memory input-/output logic. Address and command information for the RAM sections are applied to the sections via buses 207 and 208 respectively. This information is of the type necessary to address specific rows of storage in the RAM and to command the RAM sections to accept information from the input/output circuitry for storage in a particular row or to present information from a specific row to the input/output circuitry. The logic necessary to generate this address and command information in response to command information from the processor is dependent on the specific type of RAM used in the audio response unit. Given a specific RAM the design of this logic would be obvious to one skilled in the art. This logic forms no part of the invention described herein and therefore that portion of logic 202 which generates address and command information for the RAM sections in response to command information from the processor will not be described in further detail. Logic 202 also generates a clock signal which is applied to the input/ouput circuitry and logic 215 via path 206. The clock necessary to generate this signal is a free running oscillator of the type well known in the art and will not be described further. Logic 202 also generates a load port circuit control signal which is applied to logic 215 via path 218. The remaining signal generated by logic 202 is a load command signal applied to the input/output circuitry via bus 205. The relationship of the load command signal and the load port circuit control signal to the other signals utilized in the audio response unit is shown in FIG. 5 and will be discussed hereinafter. The logic necessary to generate these signals will be obvious to one skilled in the art when the relationship of these signals to the other signals is discussed in conjunction with FIG. 5. Load logic 204 accepts mode control commands from central station 100 and in response thereto generates two control signals, the enable load signal, and the enable recirculate signal. These control signals are applied to each memory input/output circuit via signaling paths 230 and 231 and will be described in detail hereinafter. Each memory section 0 through 15 has associated therewith memory input/output circuitry shown as memory input/output 210 associated with memory section 0, through memory input/output 226, associated with memory section 15. Each of the remaining memory sections 1 through 14 have associated therewith an identical memory input/output circuit. Memory input/output circuit 210 and the associated input/output circuits function to extract information from the memory sections and function to store information in each memory section. The input/ouput circuits are controlled by commands from memory address counter and control logic 202, and load logic 204 in a manner to be detailed hereinafter. Grunt buffer and control logic 215 accepts grunt number addresses (i.e., the address of a particular grunt stored in the memory sections) from central station 100 and applies these addresses to bus 216. Control logic 215 also generates certain clock and control signals and applies these signals to bus 217. The details of control logic 215 will be described hereinafter. Bus 216 is extended to port circuits 0 through 111, and bus 217 is extended to port circuits 0 through 111 and to parity logic 221. Each port circuit accepts information from each memory input/output circuit, and converts this information into audio response messages as will be detailed hereinafter. The audio response messages are applied to output leads 222, 223, etc. Parity logic 221 functions to perform two types of parity checks on the contents stored in each memory section. The manner in which these parity checks are accomplished will be detailed hereinafter.

Refer to FIG. 4. Therein is shown the details of one port circuit such as port circuit 0. The remaining port circuits are arranged in an identical manner. Data buses 234 through 250 extending from each memory input/output circuit are applied to input terminals 400 through 415 and extended to selector 418. Grunt number bus 216 is applied to input terminals 425 through 428 and to input terminals 433 through 439. The 4 bits appearing on input terminals 425 through 428 are stored in 4-bit latch 419 and are applied to selector 418. In response thereto, selector 418 selects one of the 16 incoming data buses defined by the 4 bits and applies that selected data bus to lead 440 extending to flip-flop 422. The bits appearing on input leads 433 through 439 are applied to programmable counter 421 and function to preset counter 421 to a particular state out of 112 states defined by the incoming bits. Also applied to counter 421 is a port clock, load and enable signals extending from port control bus 217 via input terminals 429 through 432 and input terminal 417. The function of counter 112 will be described hereinafter. D/A converter 423 and its associated circuitry functions to convert the digitized speech extracted from the RAM into an audio output which is applied to lead 222 and transmitted to the remote terminals. The function performed by the D/A converter and its associated circuitry of converting a serial digital signal into an audio signal is well known in the art and therefore will not be described in further detail.

Refer to FIGS. 2 and 5. The method of extracting information from the RAM will now be described in detail. Waveform A in FIG. 5 is the shift clock pulse train generated by logic 202 and applied via path 206 to the clock input of register 212 and to the remaining input/output circuits. The shift clock waveform is a free-running clock continuously applied to the input/output registers. Extracting information from a memory section begins with a load command from logic 202 applied to gates 211 and register 212 in each memory section via lead 205. This load command is shown as Waveform B in FIG. 5 and is generated by logic 202 in response to a command applied to logic 202 from the processor in central station 100 via bus 108 and terminal 200. Assume also that in response to the command from the central station processor, logic 202 at this same time addresses row 0 in each memory section via buses 207 and 208 such that the information in row 0 of each memory section will be presented to gates 211 in the memory input/output circuitry. (It is to be understood that logic 202 applies the address commands to every memory section but as all memory sections operate in the same manner, only memory section 0 will be described in detail.) The load command applied to gates 211 enables these gates to transfer the information from row 0 in the memory section to register 212 for storage. The load command applied to the LO/SHIFT input of register 212 places the register in the load mode to accept the information from gates 211 and thereafter register 212 reverts to the shift made to allow the information stored in the register to be shifted out. The information stored in register 212 is clocked from this register in response to the shift clock pulse train and appears on data bus 234. Gate 214 is at this time disabled as will be described hereinafter such that the information is applied to the port circuits via bus 234. Waveform D in FIG. 5 illustrates the format of the information appearing on bus 234 as it is clocked out of register 212. As is shown therein, the information consists of the bits from planes 0 through 12 of the memory section with the bits being bit 0 of grunt 0, bit 0 of grunt 8, etc. Subsequent to loading row 0 into register 212, an increment memory pulse (Waveform C in FIG. 5) is applied via lead 207 to memory sections 0 through 15. In response thereto, each memory section applies the contents of row 1 from the section to the memory input/output circuit subsequent to the increment memory address pulse, an additional load command from control logic 202 is applied to gates 211 and register 212 in each memory input/output circuit. In response thereto, row 1 from each memory section is then stored in register 212. This process of incrementing the memory address and extracting a particular row from a memory section continues until all the information stored in each memory section has been applied to the output data bus of each memory input/output logic circuit. The format of the data on a particular data bus can be illustrated by referring to Waveforms E and F in FIG. 5. As is shown therein, segment 0 of waveform E contains the 13 bits of information from row 0 of a particular memory section. For example, segment 0 contains bit 0 from grunt 0, 8, 16, etc. up to grunt 96. The 14th bit (labeled S) shown in segment 0 is reserved for control purposes. Section 1 of Waveform E contains the contents of row 1 from a memory section. For example, segment 1 contains bit 0 from grunts 1, 9, 17, etc. up to grunt 97. The remaining segments of Waveform E contain bit 0 from the remaining grunts stored in the memory section. As is shown in FIG. 5, Waveform E illustrates the 112 bits resulting from extracting bit 0 from all 104 grunts stored in a memory section and applying these bits to the memory input/output data buses. Therefore Waveform E contains 1 bit (bit 0) from each grunt stored in a memory section. This segment of 112 bits will hereinafter be referred to as a frame of data. Waveform F in FIG. 5 is a representation of the data bus format containing all bits from all grunts stored in a particular memory section. This waveform is therefore comprised of 4,096 frames of data with each frame containing 1 bit from each grunt stored in a memory section. For example, frame 0, of Waveform F corresponds to Waveform E and shows the position of bit 0 from each grunt on the data bus. Frame 1 of Waveform F shows the position of bit 1, frame 2 shows the position of bit 2, etc., up to frame 4,095 which shows the position of bit 4,095 of each grunt on the data bus. As is shown in FIG. 5, Waveform F illustrates the data format when each bit of all 104 grunts stored in a memory section are applied to the input/output circuit data buses. The combination of all 4,096 frames of data on the data bus will hereinafter be referred to as a superframe of data.

The foregoing has illustrated how information stored in each memory section has been applied to the data bus and in turn to the port circuits. It is now necessary to extract certain bits from that information in order to form response messages to the remote terminals. Extracting this information is accomplished by port circuits 0 through 111 in response to grunt addresses applied to the port circuits from grunt buffer and control logic 215.

Refer to FIG. 5. Waveform G in FIG. 5 is the load port circuit control waveform generated by logic 202 and applied to logic 215 via path 218. This waveform is normally high and goes low simultaneously with frame 4,095 illustrated in Waveform F. Therefore, this waveform is high throughout the entire superframe of data on the data bus and goes low for the last frame of the superframe. Waveform G is extended as is shown in FIG. 5 to the time interval illustrated by Waveform H. Waveform I in FIG. 5 occupies this same time interval. Waveform I illustrates the grunt address information applied to grunt number bus 216 during the interval illustrated by Waveform H. As illustrated in Waveform I the grunt address information is serially applied to the grunt bus by logic 215 with the grunt number for port 0 appearing first, the grunt number for port 1 appearing second, etc. This information is utilized to command the port circuits to extract certain grunts from the data buses as will be illustrated hereinafter.

Refer now to FIGS. 4 and 7. From what precedes, it has been shown that grunt address information is applied to grunt bus 216 and to each port circuit during the last frame of the superframe existing on the data buses. The grunt address information is stored in the grunt buffer by the processor in central station 100 and applied to the grunt bus in a manner to be detailed hereinafter. This grunt address information is applied to input terminals 425 through 428 and input terminals 433 through 439 in FIG. 4. This information will now be used to select one of data buses 0 through 15 and to select a particular grunt from the superframe of data on the data buses.

Waveforms B through M in FIG. 7 illustrate waveforms generated by control logic 215 and applied to the port circuits via bus 217 in a manner to be detailed hereinafter. Waveform N in FIG. 7 illustrates the grunt addresses applied to bus 216 (FIG. 2) by logic 215. Each interval P0 through P111 illustrates the interval each grunt address occupies on bus 216 wherein P0 is the grunt address for port circuit 0 and P1 is the grunt address for port circuit 1, etc. Waveform A in FIG. 7 illustrates the load port circuit control waveform generated hy logic 202 and designated as Waveform H in FIG. 5. More particularly, Waveform A illustrates the interval corresponding to the interval occupied by frame 4,095 in the superframe of data on the data buses. Waveforms B and K in FIG. 7 are port control commands applied to input terminals 429 on selected ones of the port circuits (FIG. 4). Waveform B in FIG. 7 is applied to port circuits 0 through 15. Waveform K is applied to port circuits 16 through 31. Not shown in FIG. 7 are five additional waveforms which perform the same function as waveform B and K. These waveforms are applied to input terminal 429 of port circuits 32–47, 48–63, etc. Waveforms C through J are applied to input terminals 430 on selected ones of the port circuits. Waveform C in FIG. 7 is applied to port circuits 0 and 1, 16 and 17, etc. Waveform D is applied to port circuits 2 and 3, 18 and 19, etc., and Waveform E is applied to port circuits 4 and 5, 20 and 21, etc. Waveforms F through J are applied to the remaining port circuits in the same manner as discussed for Waveforms C through E. Waveforms L and M in FIG. 7 are applied to input terminals 431 on alternate port circuits as is indicated in FIG. 7. Refer now to FIG. 4 and assume that this figure represents port circuit 0. As has been described above, in accordance with FIG. 7, the grunt addresses on grunt bus 216 are applied to each port circuit during frame 4,095 of the superframe. From FIG. 7 it can be seen that Waveforms B, C and L are all low during the interval occupied by grunt address P0 on bus 216. As described above, Waveforms B, C and L are applied to input terminals 429 through 431 on port circuit 0. In response thereto, gate 420 (FIG. 4) is enabled which in turn enables latch 419. Latch 419 applies 4 bits of information from the grunt bus to selector 418. As described above these 4 bits of information define a particular one of the data buses applied to input terminals 400 through 416 on the port circuit. In response thereto selector 418 selects one of the 16 data buses defined by the last 4 bits of the grunt address and applies that data bus to path 440 and in turn to flip-flop 422. The output of gate 420 also applies a load command to the load input of counter 421. (Counter 421 is disabled by Waveform A FIG. 7 being applied to the EN input and therefore is not counting at this time.) The load command applies the remaining 7 bits of the grunt address to the inputs of counter 421. These 7 bits preset counter 421 to a particular state defined by the 7 bits from among the possible 112 states in counter 421. Port circuit 1 would be similarly enabled by Waveforms B, C and M such that port circuit 1 would select one of the 16 data buses, and the counter in port circuit 1 would be preset to a state defined by grunt address P1 on bus 216. The remaining port circuits would be preset in the same manner. At the conclusion of frame 4,095 in the superframe therefore, each port circuit has been present to select one of the 16 data buses and preset to select one of a possible 112 states. Referring now to FIG. 5, Waveform E, it can be seen that each frame of the superframe contains 112 bits with each bit (except the control bits) being one bit from a particular grunt stored in the RAM.

Refer now to FIGS. 4 and 7A. Waveform A in FIG. 7A illustrates the load port circuit control waveform generated by logic 202 which has been previously described in FIGS. 5 and 7. This waveform is applied to input terminal 432 of each port circuit and when this waveform goes high, it enables counter 421. Counter 421 in response to the port clock appearing on terminal 417 will begin counting at this time at the state that has been preset by the first 7 bits of the grunt address. This counter will then count from that preset state to state 112 at which time the Q output of counter 421 will go high and be applied to the toggle input of flip-flop 422. This flip-flop will then extract one bit of data appearing on lead 440 and apply that bit to D/A converter 423. Referring to Waveforms B and C in FIG. 7A, it can be seen that Waveform B represents the superframe on each of the data buses. This superframe of data is identical to the superframe shown in Waveform F in FIG. 5. Waveform C in FIG. 7A illustrates that counter 421 begins counting when enabled by the load port circuit control pulse and counts 112 minus the grunt number clock cycles at which time one bit of data from the superframe is strobed into flip-flop 422 and applied to D/A converter 423. Counter 421 then resumes counting for an additional 112 clock cycles at which time a second bit of data will be strobed from the superframe and applied to flip-flop 422. This process continues with counter 421 strobing every 112th bit from the superframe. Referring now to Waveforms E and F (FIG. 5), it can be seen that counter 421 if preset to begin with bit 0 of grunt 0 will count 112 clock cycles and then strobe bit 1 of grunt 0, count an additional 112 cycles and strobe bit 2 of grunt 0, etc. Similarly counter 421 could be preset to begin with bit 0 of any grunt stored in the RAM and would thereafter extract all the bits of the grunt. In this manner, therefore, presetting each counter in each port circuit allows each port circuit to extract from the data buses the bits from any particular grunt stored in the RAM and apply the bits from that grunt to the D/A converter and its associated circuitry which will in turn reconvert the bits of the digitized grunt into an audio response message. Therefore extracting information from the random access memory is simply accomplished by presetting each port circuit with a particular grunt address and then allowing that port circuit to repetitively extract from the data buses each bit from that particular grunt and convert that grunt into an audio response message.

The preceding has described the procedure for extracting digitized speech from the RAM and converting that digitized speech into audio response messages. The procedure for loading digitized speech into the RAM will now be described in detail. Various procedures exist for converting audio speech into digitized speech for insertion into a solid state memory. Such conversion procedures are not part of this invention. Therefore it will be assumed that apparatus which is not part of this invention is included in central station 100 and accepts audio messages to be stored in the audio response unit. The apparatus is advantageously designed to convert the audio messages into a digital pulse train ready for storage in the RAM. This digital pulse train would then be applied to the general purpose computer in central station 100. The general purpose computer is programmed to divide the digital pulse train into serial grunts. The serial grunts are then applied via data bus 107 to input terminal 201 of the audio response unit. The general purpose computer in central station 100 is programmed to distribute the various grunts to the memory sections in which the grunts are to be stored. More particularly bus 107 extending from the computer is 16 leads wide with 1 lead going to gate 213 in each memory input/output circuit via bus 232. The computer assembles the grunts in serial form and applies the serial grunts simultaneously to the correct memory input/output circuit via the separate leads of bus 107 and bus 232. At the time central station 100 applies the grunts to data bus 107, central station 100 also applies command information to mode control bus 108. The command information would be applied to terminal 200 and from there to control logic 202 and load logic 204. The command information can be of any suitable format and functions to instruct control logic 202 and load logic 204 that incoming grunts have been applied to data bus 107.

Refer to FIG. 6. The command information to instruct control logic 202 that serial grunts have been applied to data bus 107 is assumed to take the form of Waveform D in FIG. 6. The load data pulse in Waveform D is applied to input terminal 200 and from there to control logic 202. In response thereto, control logic 202 will supply address and command information to each memory section, instructing each memory section to read out the data stored in row 0 and apply that data to the inputs of gates 211. Control logic 202 will also generate Waveform B in FIG. 6 and apply this waveform via path 205 to gates 211 in memory input/output circuit 210 and of course to the remaining input/output circuits. In response thereto, gates 211 in each memory input/output circuit will gate the first row of information stored in the memory sections from the memory into register 212 in each memory input/output circuit. The information stored in register 212, from memory section 0, is represented by Waveform C in FIG. 6, and will be shifted from register 212 by the shift clock and will be applied to path 234 and 219 to the input of gate 214. The same process occurs for each memory input/output circuit. The information shown in Waveform C as segment 0 represents the information stored in row 0 plane 0 of memory section 0, segment 1 represents the information stored in row 0 plane 1, etc. In this manner, the information stored in register 212 for each memory input/output circuit is recirculated from the output of register 212 back to the input of register 212.

Recall that central station 100 is attempting to store incoming grunts in each memory section. The grunts are in serial form and are to be stored in each memory section beginning with plane 0 and progressing through plane 12. More particularly, referring to FIG. 3B, it can be seen that the stream of serial grunts would begin with bit 0 of grunt 0 which would be stored in plane 0 row 0, followed by bit 1 of grunt 0 which would be stored in plane 0 row 8, etc. The bits of grunt 0 would be followed by the bits of grunt 1, etc. The serial stream of grunts for each memory section is organized in the same manner and each stream consists of the grunts to be stored in a particular memory section.

Load logic 204 in response to the command information applied thereto via bus 108 generates Waveforms E and F (FIG. 6). These waveforms are applied to gates 213 and 214 in each memory section via buses 230 and 231. As described above, the incoming grunts are to be stored in each memory section beginning with plane 0. As is shown in FIG. 6, Waveform E goes low and Waveform F goes high in conjunction with the data in row 0 plane 0 appearing on the data bus. This data is identified as segment 0 in Waveform C. At the time, segment 0 of the information stored in register 212 appears on the data bus it is applied to the input of gate 214 in each memory section. The EN REC waveform going low disables gate 214 and the EN LOAD waveform going high, enables gate 213. Therefore the information from row 0 plane 0 for each memory section is prevented from being clocked into register 212 while at the same time, the first bit of the incoming grunt appearing on bus 232 is applied to the input of enabled gate 213 in each memory section. This bit is clocked into register 212 in the position previously occupied by the information that was stored in row 0 plane 0 of each memory section. Subsequent to segment 0 of Waveform C, the EN REC waveform returns high and the EN LOAD waveform returns low. Therefore the remaining information appearing on bus 234 is simply recirculated from the output of the register back to the input of the register via enabled gate 214. Subsequent to segment 12 of Waveform C, all 13 bits originally stored in register 212 have been recirculated back to their original positions. At this time, Waveform G goes high. Waveform G is a load command from control logic 202 which is applied to gates 211 via path 205. In response thereto, the information stored in register 212 is gated from register 212 back into row 0 of memory section 0. This information, as previously described, now contains the first bit of the incoming grunt which was inserted in register 212 in the position corresponding to plane 0 of row 0 in memory section 0. Therefore, when this information is reloaded into the memory, the first bit of the incoming grunt is loaded into row 0 plane 0, while the remaining bits previously stored in row 0 which have not been changed, are simply reloaded unchanged into their previous locations.

Subsequent to reloading the information into the memory, Waveform H goes high. Waveform H generated by control logic 202 is applied via address bus 208 to memory section 0 and to the other memory sections and adds 8 to memory address. Therefore, row 8 of each memory section will be accessed next. Referring to FIG. 3B, it can be seen that row 8 of memory section 0 contains the second bit of the grunts stored in the memory section.

The procedure described above for loading the first bit of the incoming grunt into the memory section is now repeated with the information stored in row 8 of the memory section. This information from row 8 is loaded into register 212, recirculated, and reloaded into the memory after the information stored in row 8 plane 0, has been replaced by the second bit of the incoming grunt. This process continues and functions to load the incoming serial grunt, bit by bit, into plane 0 of each memory section. This same process is repeated to load each plane of each memory section.

In summary, a serial incoming grunt is applied by central station 100 to the audio response unit via bus 107. Simultaneous therewith central station 100 applies command information to logic 204 and logic 202 to alert the logic that incoming grunts are to be stored in the memory sections. Logic 202 and logic 204 supplies address and command information to the memory sections and their associated input/output circuit. In response thereto the incoming grunts are loaded bit by bit into the columns of the memory array. This process is accomplished by reading out the rows of the memory sections, recirculating the information stored in the rows, replacing one of the bits of the recirculated information with successive ones of the bits of the incoming information, and reloading that information into the positions previously occupied by this row of information in the memory array. This process of loading the information into the memory on a column by column basis functions to prevent the prior art problems of memory streaking. Recall from the description of the prior art that memory streaking occurred in the prior art when a word being loaded into a particular row of the memory array was shifted one position left or right in the input serial to parallel converter due to the gain or loss of a clock transfer pulse. This resulted in shifting the entire incoming stream of data one position left or right such that all bits subsequent to the error would be written into the wrong memory column. When this occurred, it became necessary to reload the memory due to the large number of errors contained therein. In the instant invention a similar shifting of the incoming data stream would occur if the computer in central station 100 would transfer a bit to the audio response unit via bus 107 and for one reason or another would fail to command load logic 204 and control logic 202 to load the bit into the memory array in the manner described above. The result of such an error with the instant invention, however, advantageously does not result in catastrophic failure as it does in the prior art. More specifically assume serial grunts are being loaded into a particular memory section. The format of the incoming data advantageously consists of the bits of grunt 0 in sequence followed by the bits of grunt 1 in sequence etc. If the computer failed to provide the proper command when the first bit of the first grunt was applied to bus 107 the first bit would be lost. Assume now that the proper command was received when the second bit was applied to bus 107. The second bit would then be loaded into row 0 plane 0 of the memory section which is the incorrect position for that bit. Similarly, the third bit would be loaded into row 8 plane 0, the fourth bit would be loaded into row 10 plane 0 etc. All subsequent serial bits in the incoming data stream would thus be shifted one position and would be loaded into the wrong position in the particular column into which they were being stored. The result of the error therefore would be that the information stored in each column of the memory array subsequent to the error would be shifted one position up or down from its proper position in the columns. A shift up or down one position in the columns results in each grunt being shifted one position such that each grunt in a column will have one incorrect bit.

As has been previously stated, one incorrect bit in each grunt does not affect the audio output. Therefore it can be seen that a shift in the incoming data stream advantageously results in a limited number of errors that are undetectable in the audio output. In contrast, a shift in the incoming data stream in the prior art causes each bit in each grunt stored in the memory subsequent to the error to be incorrect due to the row-by-row loading method in the prior art.

Refer to FIG. 8. Therein is shown the details of parity logic 221 which is illustrated in block diagram form in FIG. 2. Parity logic 221 functions to check the sanity of the RAM by performing two types of parity checks. The first type of parity check is designated as a soft parity check. The soft parity check essentially consists of checking the parity across each row of the random access memory. Recall from what was described above that a data bus from each memory section input/output circuit is applied to the parity logic. Each data bus carries a data stream as indicated in Waveforms E and F, FIG. 5, wherein the information from each row of a memory section is successively applied to the data bus. The soft parity check procedure first selects four of the data buses from among the sixteen available data buses. The four data buses selected correspond to a particular shelf of the memory wherein a memory shelf consists of four memory sections as is illustrated in FIG. 3A. A parity check is performed on the 4 bits which comprise row 0 plane 0, in the four memory sections. This process is then repeated throughout the rows of the memory wherein parity would be successively checked for row 0 plane 1, row 0 plane 2, etc., until a parity check had been completed on a particular row extending across one shelf or four sections of the memory. The process continues until parity is checked for each row in the entire memory shelf.

The memory is arranged such that each row of a particular shelf of the memory has even parity, i.e., an even number of binary "1's" are stored in each row of a memory shelf. (Note that each shelf consists of four sections so that one row from one memory shelf consists of 52 bits.) If an odd number of binary "1's" are detected in a particular row of a memory shelf it indicates that one or more of the bits stored in that row are incorrect. The soft parity technique counts the numbers of rows in each memory shelf in which odd parity occurs. If the number of rows in which odd parity is detected exceeds a predetermined threshold number, the computer in central station 100 is notified of a memory malfunction. The predetermined threshold number is set by the computer and stored in the parity logic before a parity check is performed in a manner to be detailed hereinafter. Therefore, the computer will not be informed of a memory malfunction until the number of rows in which odd parity is detected exceeds the predetermined threshold number which was previously set by the computer. Recall from what was described above that digitized speech stored in a random access memory can tolerate a certain number of errors before the speech output is distorted. Therefore, with this method, the computer can determine the number of errors which can be tolerated in the memory array and preset the parity logic to the threshold number of errors. Once the parity logic is preset, the computer will not thereafter be notified of a memory malfunction until the preset threshold number is equaled or exceeded.

The second type of parity check performed by the parity logic is a background type of maintenance and is designated as a check sum parity check. This scheme is utilized periodically, perhaps once a day, and is normally accomplished when the memory is off line. This procedure essentially consists of adding all the binary "1's" in each column of the memory array. The 8 least significant bits of this sum for each memory plane is then sent to the computer in central station 100. The computer knows the number of binary "1's" that should be stored in each plane. Sending the computer the 8 least significant bits defining the number of "1's" in each plane allows the computer to note trends in the sanity of the memory and could, for example, allow the computer to detect gradual degradation in the memory over a period of time. In addition to detecting trends in memory sanity, this procedure is also useful when utilized subsequent to the soft parity technique to isolate a particular memory plane or planes that are malfunctioning as will be detailed hereinafter.

The parity logic operation will now be described in detail. Refer to FIG. 8. Input terminal 800 carries information from path 251 (FIG. 2). This information is illustrated in FIG. 5, Waveform B, as the "load shift register from memory" waveform. This waveform is applied to retiming circuit 801 which retimes Waveform B to correspond to the logic operations performed by the parity logic. Such retiming functions are well known in the art and will not be discussed in further detail. The 16 data buses from the memory sections are applied to selector 805 which functions to select four of the 16 buses in response to address bits applied to selector 805 from selector 806. Selector 806 selects either of input buses 822 or 823 and applies these buses to selector 806 as will be detailed hereinafter. Shelf counter 824 functions to select a particular memory shelf on which to perform the soft parity check as will be subsequently described. Latches 810 and 811 accept information from the computer via bus 232 (FIG. 2). The information applied to latches 810 and 811 consists of either the predetermined number of threshold parity errors which has been predetermined by the computer or alternatively this information defines a particular plane in the memory on which to perform the check sum parity check. Input terminal 812 accepts information from bus 217 in FIG. 2. This information is the load port circuit control pulse illustrated as Waveform G in FIG. 5. Input terminals 813 and 814 accept information from the processor via bus 232 which determines the mode of the parity logic, i.e., either the check sum mode or the soft parity mode. Parity check circuit 817 operates during the soft parity mode and functions to check the parity in each row of a memory shelf as will be detailed hereinafter. Parity flip-flop 819 determines odd or even parity for each memory shelf. Selector 818 functions to select a particular bus from among the 16 data buses and operates in conjunction with counter 828 to select a particular memory plane during the check sum mode of operation. Counter 835 is an 8-bit counter in which the predetermined threshold number of parity errors is used to preset the counter to the threshold state. This counter also functions to count the number of binary "1's" in a particular memory plane during the check sum mode of operation. Latches 838 and 839 store information to be transferred to the computer via output drivers 840 and 846 as will subsequently be described. Mode circuit 816 accepts commands from the computer via buses 217 and 232 and generates selected output signals as will be detailed hereinafter.

Figure 9:
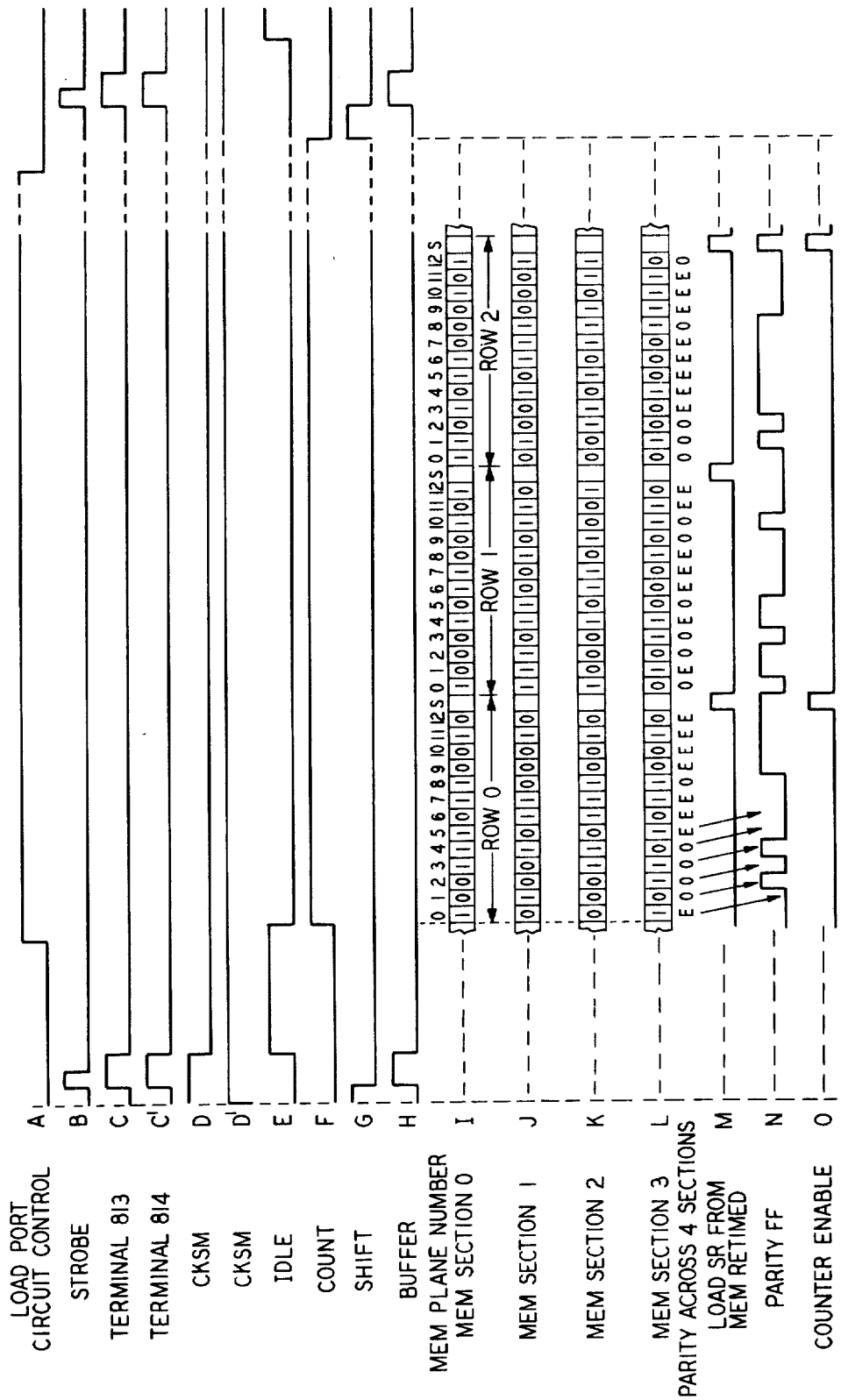
FIG. 9 discloses a timing diagram for the parity logic.

Refer now to FIG. 9 and assume that the computer in central station 100 desires to place the parity logic in the soft parity mode. As described above, Waveform A in FIG. 9 is the "load port circuit control" waveform illustrated as Waveform G (FIG. 5). This waveform is applied to terminal 812 of mode circuit 816. Mode circuit 816 is enabled in response to this waveform going low and generates certain output signals as will subsequently be described. As circuit 816 is enabled when this waveform goes low, it is to be noted that the functions performed by mode circuit 816 occur during frame 4,095 of the superframe in FIG. 5. Waveform B in FIG. 9 represents a strobe command from the computer in central station 100 applied to input terminal 807. When waveform B goes high, the computer loads 8 bits into latches 810 and 811 defining the threshold number of rows in the RAM in which parity errors can be detected before a memory malfunction is indicated.

At the time the 8 bits are loaded into latches 810 and 811 the computer applies Waveform C to input terminal 813 thereby notifying circuit 816 to enter the soft parity mode. In response thereto the CKSM output of circuit 816 goes low and the IDLE output goes high. The CKSM output going low applies a high to one input of gate 833 via inverter 825. The remaining input of gate 833 also goes high in response to the IDLE output. Gate 833 then applies a LD (load) pulse to counter 835 which loads the information stored in latches 810 and 811 into the preset (PS) input of counter 835 via bus 841. These 8 bits preset counter 835 to a predetermined state equal in number to 256 minus the threshold number of rows in which parity errors can occur before memory malfunction is indicated. The CKSM output of mode circuit 816 is also applied to selector 806. In response thereto, selector 806 selects bus 823 extending from shelf counter 824. Counter 824 which was initially cleared, applies 2 bits via bus 823 to selector 806. These 2 bits which are both logical "0's" (as counter 824 was cleared) are applied to selector 806 and from selector 806 to selector 805. Selector 805, in response to these 2 bits, selects data buses 0 through 3 extending from memory sections 0 through 3. Memory sections 0 through 3 comprise shelf 0 as is illustrated in FIG. 3A. Waveforms I through K in FIG. 9 illustrate the data appearing on the four data buses extending from memory sections 0 through 3. These four data buses are applied to parity check circuit 817 which functions to determine even or odd parity across each set of 4 bits appearing on the four data buses. As is illustrated in FIG. 9, plane 0 of row 0 results in even parity. (This is indicated in FIG. 9 as an "E" appearing directly beneath plane 0 of row 0.) Plane 1 of row 0, however, results in odd parity. In response thereto, parity flip-flop 819 is toggled to the SET state as is illustrated in Waveform N. Plane 2, row 0 again results in odd parity which toggles flip-flop 819 back to the CLEAR state. This process continues until row 0 in all four memory sections has been checked. If the bits in row 0 from the four memory sections consist of an odd number of binary "1's", flip-flop 819 will be in the SET state at the conclusion of the parity check for that row. At this time, Waveform M (the "load SR from memory" pulse from buses 205 and 251, FIG. 2) is applied to input terminal 800. This waveform goes high, which applies a high to one input of gate 820. The remaining inputs of gate 820 are also high as $\overline{\text{CKSM}}$ is high add flip-flop 819 is in the SET state. In response thereto, a pulse is applied via gate 826 and enabled gate 834 (COUNT is high) to the EN input of counter 835. Counter 835 is therefore clocked to the count of "1", indicating that there was a parity error in the first row of the memory shelf. This process continues for each row of the memory shelf as is illustrated in FIG. 9. Waveforms I through N and each time a parity error is detected, counter 835 is clocked to the next state. If during this procedure the number of rows in which parity errors were detected exceeds the preset state of counter 835, the OF (overflow) output of the counter will go high placing overflow flip-flop 836 in the SET state. When one complete shelf has been checked, Waveform F returns low. In response thereto, mode circuit 816 generates the Shift and Buffer outputs as is shown in FIG. 9. The buffer output toggles counter 824 to binary state "01". The shift output clocks the contents of overflow flip-flop 836 into register 837. (Waveforms B and C also go high in conjunction with the buffer output but have no effect at this time.) The procedure described above then begins again. However, at this time, counter 824 is in state "01". In response thereto, selector 805 selects the four buses corresponding to shelf 1 of the memory. Parity is then checked for each row in the second shelf of the memory. If the number of rows containing parity errors in this shelf exceed the predetermined threshold number stored in counter 835, then counter 835 will again overflow, setting flip-flop 836. At the conclusion of the parity check for shelf 1, the buffer and shift outputs again go high. Counter 824 is then placed in state "10" and the bit stored in flip-flop 836 is clocked into register 837. This procedure continues until parity has been checked for each row in all four shelves of the memory. At the conclusion of the parity check for shelf 3, counter 824 will be in state "11" thereby enabling gate 829 (the $\overline{\text{CKSM}}$ output is high). This in turn enables gate 831 via gate 830. Therefore at this time when the buffer output goes high a pulse is applied via enabled gate 831 to the clock input of latches 838 and 839. At this time the CKSM output is low and is applied to the select input of latch 839. In response thereto latch 839 selects input B applied thereto and when the pulse from gate 831 is applied to the clock input of latch 839 the four bits stored in register 837 are clocked into latch 839. These bits are then transferred to drivers 840. Subsequent to the buffer waveform returning low waveform C applied to terminal 813 returns high. This waveform is applied via gate 815 to the EN (enable) input of drivers 840 which in response thereto gates the 4 bits to bus 232 and from there to the computer. From what precedes it is clear that a bit stored in register 837 indicates that a particular memory shelf contains a number of rows in which parity errors have been detected, the number of rows exceeding the threshold number used to preset counter 835. Therefore the computer in central station 100 when examining the 4 bits from register 837 can determine which memory shelves have exceeded the threshold number of rows containing parity errors. The computer can then initiate appropriate remedial action or alternatively commence the check sum parity check to isolate the plane or planes which contain errors.

The computer enters the check sum mode by applying Waveform C' to terminal 814 simultaneous with strobing 8 bits of information into latches 810 and 811. The 4 bits stored in latch 810 define the particular plane in a memory section which is to be checked. These 4 bits are applied to counter 828 and are utilized to preset counter 828 as will be detailed hereinafter. Two of the 4 bits stored in latch 811 are applied to selector 806 and two of the 4 bits are applied to selector 818. In response to Waveform C' being applied to terminal 814, the mode circuit causes output CKSM to remain high, as is illustrated in Waveform D' of FIG. 9. This signal is applied to selector 806 which in response thereto selects bus 822. The 2 bits appearing on bus 822 are applied via selector 806 to selector 805 and function to select four out of the 16 data buses. Similarly, the 2 bits appearing on bus 842 are applied to selector 818 and function to select one of the previously selected four buses. Therefore, applied to retiming circuit 821, is the data on a particular selected bus. This data has the format indicated in Waveforms E and F of FIG. 5. The data is retimed by circuit 821 to conform with the timing of the parity logic and applied to input 1 of gate 827. Input 2 of gate 827 is high at this time due to the CKSM output being high. Input 3 to gate 827 goes high each time the OF output of counter 828 goes high. As described above, counter 828 is preset with the 4 bits stored in latch 810. These 4 bits define which plane in a particular memory section is to be checked. More particularly, counter 828 is preset by these 4 bits to overflow (i.e., the OF output goes high). Counter 828 is a MOD 14 counter and therefore will complete one cycle every 14 clock pulses. Refer to FIG. 9, Waveform I, and assume that the data bus from memory section 9 has been selected in the manner described above and has been applied to input 1 of gate 827. As is shown in FIG. 9, Waveforms F and I, the COUNT waveform goes high in conjunction with the bit from the first plane of a memory section. The COUNT waveform is applied to the EN (enable) input of counter 828 such that counter 828 will begin counting as the bit from the first plane is applied to input 1 of gate 827. The clock associated with counter 827 is synchronized with the data being applied to gate 827 such that counter 828 will advance 1 state each time a bit is applied to gate 827. Assume that counter 828 is preset to overflow with the fourth clock pulse, i.e., counter 828 will overflow at the time the bit from plane 3 row 0 is being applied to input 1 of gate 827. When the OF output of counter 828 goes high gate 827 is enabled and gates the bit from plane 3 row 0 through gate 826 and enabled gate 827 (i.e., COUNT is high) to the input of counter 835. If this bit is a logical "1" counter 835 will advance to a first state. Counter 828 will continue counting and will overflow after 14 additional clock pulses. Referring to FIG. 9, Waveform I, it can be seen that counter 828 will overflow at the time the bit from plane 3 row 1 is being applied to gate 827. This bit will therefore be applied to counter 835 in the manner described above. This process continues until all the bits from the selected plane have been applied to counter 835. Counter 835 proceeds to count modulo 256 the number of binary "1's" stored in the selected memory plane. At the conclusion of the count interval, the COUNT waveform (Waveform F in FIG. 9) goes low. In response thereto, the BUFFER output of circuit 816 goes high and is applied to one input of gate 831. The remaining input of gate 831 is also high due to the CKSM output applied thereto via gate 830. Gate 831 therefore applies a CK (clock) pulse to the CK inputs of latches 838 and 839. Latch 839 has selected input A in response to the high CKSM output being applied to the select input. Therefore latch 839 stores the 4 bits from counter 835 appearing on bus 843. Latch 838 has similarly stored the remaining 4 bits in counter 835 via bus 844. Latches 838 and 839, in response to the buffer pulse, transfers the 8 bits of data stored in counter 835 to the output drivers. These 8 bits of data are the 8 least significant bits of the number of "1's" stored in the selected memory plane. Subsequent to the Buffer output returning low, Waveforms B and C' return high. Waveform C' is applied via path 845 and gate 815 to the EN (enable) inputs of drivers 840 and 844. The drivers then gate the 8 bits of information defining the number of binary "1's" in a particular memory plane to the computer. It is assumed that the computer will have stored therein the correct number of binary "1's" for each plane and thus will be able to use the 8 bits of information to identify particular memory planes that are malfunctioning.

Figure 10:
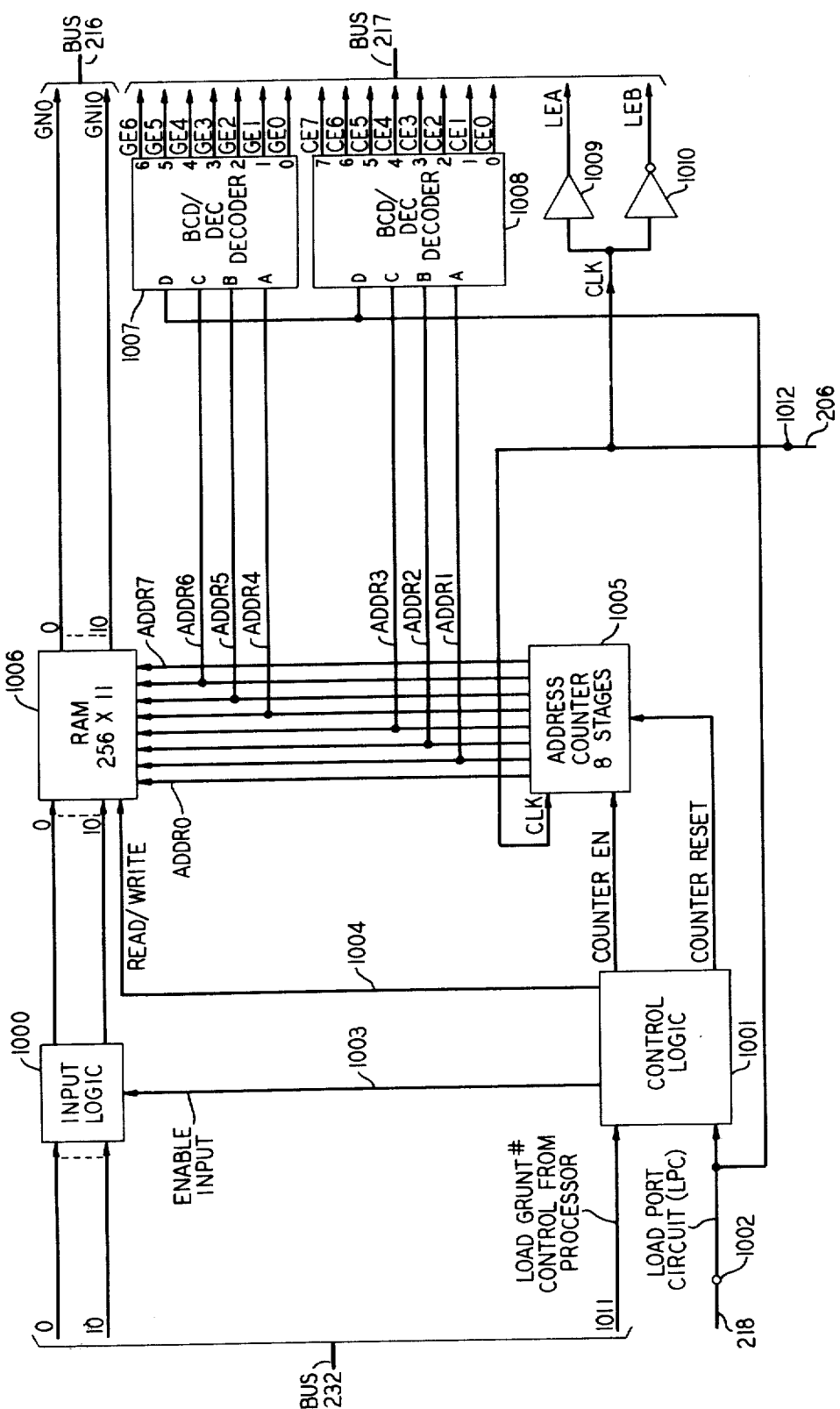
FIG. 10 discloses the details of control logic 215 shown in block diagram form in FIG. 2.

Refer to FIG. 10. Therein is shown the details of control logic 215 which is shown in block diagram form in FIG. 2. Bus 232 extending from terminal 201 applies information to input logic 1000 and control logic 1001. The information applied to logic 1000 consists of the 11-bit grunt address which is used to preset the port circuits as described above. These 11 bits are inserted into logic 1000 and thereafter are gated to memory 1006 in response to a control signal applied to the enable input of logic 1000. Bus 232 applies a load command from the processor via path 1011 to logic 1001. Logic 1001 in response to this load command generates certain control signals as will be detailed hereinafter. Memory 1006 is a standard random access memory and could, for example, consist of 11 RAM SN74S201 manufactured by Texas Instruments, Incorporated. This memory is utilized to store the grunt addresses and to apply these addresses to bus 216. Counter 1005 is a standard binary counter used to supply addresses to memory 1006 and decoders 1007 and 1008 in a manner to be hereinafter described. Decoders 1007 and 1008 are standard BCD/decimal decoders and could for example be 41CD decoders manufactured by Western Electric Company, Incorporated.

Decoders 1007 and 1008, in response to address signals applied to the A through C inputs, function to generate clock signals GE0 through GE6 and CE0 through CE7. The format of these clock signals have been described above and are shown in detail in FIG. 7. The clock signal generated by logic 202 (FIG. 2) is applied via bus 206 to input terminal 1012 and from there to counter 1005 and inverters 1009 and 1010. Inverters 1009 and 1010 in response to the clock signal function to provide clock signals LEA and LEB. Clock signals LEA and LEB have been described above and are shown in detail in FIG. 7. The grunt addresses applied to bus 216 are in turn applied to port circuits 0 through 111 (FIG. 2) and function to preset each port circuit in the manner described above. Clock signals LEA and LEB, CE0 through CE7 and GE0 through GE6 are applied to bus 217 and in turn are applied to port circuits 0 through 111. The function of these signals has been described above.

As described above, control logic 215 functions to store grunt addresses received from the processor in central station 100 and also functions to generate the clock and control signals which have been previously described. Logic 215 accomplishes these functions in the following manner. Assume address counter 1005 is initially in the CLEAR state. The processor in central station 100 formulates the grunt addresses and sequentially applies the addresses to bus 232 and in turn the addresses are applied to logic 1000. Each time a grunt address is applied to logic 1000, the processor generates a load command and applies this command via path 1011 to logic 1001. In response thereto, logic 1001 places memory 1006 in the write mode by applying a command pulse thereto via path 1004. At this same time, logic 1001 applies a command pulse to logic 1000 via path 1003 which functions to instruct logic 1000 to transfer the grunt on bus 232 to memory 1006. This first grunt is then written into location 0 of the memory. Logic 1001 then applies a counter enable pulse to counter 1005 which functions to increment this counter to the next state. The processor in central station 100 applies the next grunt address to bus 232 and generates another load command. This second grunt is gated through logic 1000 and stored in location 1 of memory 1006. Counter 1005 is then incremented to the next state, another grunt address is applied to logic 1000 and is then written into the next location in memory 1006. This process continues until the processor in central station 100 has applied a grunt address for each port card to bus 232. At the conclusion of this process, therefore, memory 1006 has stored in consecutive locations a grunt address for each port circuit.

Refer now to Waveform A in FIG. 7. As described above, Waveform A is the load port circuit control waveform which is applied to each port circuit via bus 217. During the interval in which this waveform is low, the grunt addresses are preset into the various port circuits in the manner described above. This is accomplished as follows. The load port circuit control waveform is applied via path 218 to input terminal 1002 and in turn is applied to logic 1001. In response thereto, logic 1001 applies a reset signal to counter 1005 which resets this counter to state 0. Logic 1001 also places memory 1006 in the read mode by applying a command pulse to memory 1006 via path 1004. Counter 1005 is then allowed to begin counting at the clock rate of clock 1012. The load port circuit control signal is also applied to the D inputs of decoders 1007 and 1008. A low being applied to the D inputs enables these decoders. Counter 1005 then begins counting at the clock rate. The output of the counter is applied to memory 1006 and is also applied to the A through C inputs of decoders 1007 and 1008. Counter 1005 cycles through its various states and applies sequential addresses to the memory and to the decoders. These sequential addresses function to read from memory 1006 the grunt addresses stored therein. These grunt addresses are therefore sequentially read from memory 1006 and applied to bus 216. Sequential addresses are also applied to decoders 1007 and 1008. In response thereto, these two decoders generate clock signals CE0 through CE7 and GE0 through GE6. As these decoders are standard components, the manner in which they generate the clock signals will not be further described. This process continues during the interval in which the load port circuit control signal is low. At the end of this interval, all grunt addresses will have been applied to the port circuits and will have been utilized to preset these port circuits to predetermined states in the manner described above. At the conclusion of the load port circuit control interval, this signal returns high. In response thereto logic 1001 applies a reset signal to counter 1005; counter 1005 is thus reset in preparation for subsequent lists of grunt addresses to be stored in memory 1006.

Although a specific embodiment of this invention has been shown and described, it will be understood that various modifications may be made without departing from the spirit of this invention.

What is claimed is:

1. A data access circuit for storing a string of successive binary bits in a memory array, the memory array including a plurality of intersecting rows and columns, each row and each column intersection consisting of a binary storage cell, each storage cell storing one binary bit, characterized by means responsive to the application of the string of bits to the data access circuit for producing repetitive loading sequences, each loading sequence being associated with an individual column of the memory array, means responsive to the producing means and operative during each of the loading sequences for reading out the bits stored in successive rows of the memory array, and means responsive to the reading out means and operative each time a successive row of bits is read out from the memory array for replacing the bit read out from the column associated with a particular repetitive loading sequence with a successive one of the bits in the string of bits and for writing the read out row of bits and the replaced bit back into the row.

2. A data access circuit in accordance with claim 1 wherein the replacing means includes means for storing the read out row of bits in a recirculating register and for recirculating the read out bits, and means for precluding the recirculation of the bit read out from the associated column.

3. A data access circuit in accordance with claim 2 wherein the recirculating register contains a number of binary storage positions equal in number to the number of columns in the memory array, each binary storage position being associated with one column of the memory array, the replacing means further including means for selecting a particular column of the memory array in which the string of bits are to be written, and means responsive to the selecting means for repetitively inserting successive ones of the string of bits into the binary storage position of the register associated with the particular column of the memory array.

4. A data access circuit in accordance with claim 1 further including means for checking the parity of the bits stored in each row of the memory array, means responsive to the checking means for counting the number of rows in which parity errors occur, and means responsive to the counting means for indicating a malfunction in the memory array at the time the number of rows containing parity errors exceed a predetermined threshold number.

5. A data access circuit in accordance with claim 1 further including means for distributing the bits read out from each row of the memory array to time slots in frames on a time-division highway, each frame being of $n$ bits duration and including one bit from each of $n$ multibit grunts contained in the memory array, means for identifying a selected multibit grunt to be extracted from the highway, and means responsive to the identifying means for commencing a count of the bits on the highway with a first bit of the selected grunt and for extracting the first bit and every $n^{th}$ bit thereafter.

6. In a memory array comprising a plurality of intersecting rows and columns, each row and column including a plurality of binary storage cells, each storage cell storing one binary bit, means for checking the parity of the bits stored in each row of the memory array and means responsive to the checking means for indicating a malfunction in the memory array, characterized by means responsive to the checking means for counting the number of rows in which parity errors occur, and means responsive to the counting means for normally disabling the indicating means and for enabling the indicating means at the time the number of rows containing parity errors exceed a predetermined threshold number.

7. In a memory array in accordance with claim 6 further including, means responsive to the application of a string of binary bits to the memory array for producing repetitive loading sequences, each loading sequence being associated with an individual column of the memory array, means responsive to the producing means and operative during each of the loading sequences for reading out the bits stored in successive rows of the memory array, and means responsive to the reading out means and operative each time a successive row of bits is read out from the memory array for replacing the bit read out from the column associated with a particular repetitive loading sequence with a successive one of the bits in the string of bits for writing the read out row of bits and the replaced bit back into the row.

8. A data access circuit in accordance with claim 7 further including means for distributing the bits read out from each row to time slots in frames on a time-division highway, each frame being of $n$ bits duration and including one bit from each of $n$ multibit grunts contained in the memory array, means for identifying a selected multibit grunt to be extracted from the highway, and means responsive to the identifying means for commencing a count of the bits on the highway with a first bit of the selected grunt and for extracting the first bit and every $n^{th}$ bit thereafter.

9. A method for storing a string of successive binary bits in a memory array, the memory array including a plurality of intersecting rows and columns, each row and column intersection consisting of a binary storage cell, each storage cell storing one binary bit, the method comprising the step of producing repetitive loading sequences, each loading sequence being associated with an individual column of the memory array, and each loading sequence further including the steps of,
  reading out the bits stored in successive rows of the memory array,
  replacing, in each read out row, the bit read out from the associated column of the memory array with a successive one of the bits in the string of bits,
  writing the read out row of bits and the replaced bit back into the row.

10. A method for storing a string of successive binary bits in a memory array in accordance with claim 9 wherein the replacing step further includes the steps of storing each read out row of bits in a recirculating register, recirculating the read out bits stored in the register, and precluding the recirculation of the bit read out from the associated column.

11. A method for selectively extracting a multibit binary word from a memory array, the memory array containing $n$ multibit binary words, the method comprising the steps of,
  reading out the $n$ multibit binary words stored in the memory array,
  distributing the bits of the multibit binary words to time slots in frames on a time-division highway, each frame being of $n$ bits duration and including one bit from each of the $n$ multibit binary words,
  identifying a selected multibit binary word to be extracted from the memory array,
  counting the bits on the time-division highway, commencing with a selected bit in a time slot in a first one of the frames on the time-division highway, the selected bit being the first bit from the selected multibit binary word, and
  repetitively extracting every $n^{th}$ bit counted subsequent to the selected bit.

12. A method for detecting a malfunction in a memory array, the memory array consisting of a plurality of intersecting rows and columns, each row and column including a plurality of binary storage cells, each storage cell storing one binary bit, the method comprising the steps of,
  checking the parity of the bits stored in each row of the memory array,
  counting the number of rows in which parity errors occur, and
  indicating a malfunction at the time the number of rows containing parity errors exceed a predetermined threshold number.

13. A data access circuit, comprising, means for identifying selected multibit binary words to be extracted from a memory array containing $n$ multibit binary words and means for extracting the selected multibit binary words from the memory array, the extracting means, including, means for reading out the $n$ multibit binary words from the memory array, means responsive to the reading out means for distributing the bits of the multibit binary words to time slots in frames on a time-division highway, each frame being of $n$ bits duration and including one bit from each of the $n$ multibit binary words, characterized by the extracting means further including,
  a plurality of output means, each of the output means for repetitively counting the bits on the time-division highway and for extracting every $n^{th}$ bit counted, and
  means responsive to the identifying means for enabling each of the output means at selected points in time, aligned in time with various time slots in a first one of the frames on the time-division highway, each of the various time slots containing a first bit from one of the selected multibit binary words, whereby each of the output means extract one selected multibit binary word from the time-division highway.

14. A circuit in accordance with claim 13 further including means for storing a string of successive binary bits in the memory array, the memory array including a plurality of intersecting rows and columns, each row and each column intersection consisting of a binary storage cell, each storage cell storing one binary bit, the storing means further including, means responsive to the application of the string of bits to the memory array for producing repetitive loading sequences, each loading sequence being associated with an individual column of the memory array, means operative during each of the loading sequences for reading out the bits stored in successive rows of the memory array, and means responsive to the reading out of each row of bits for replacing the bit read out from the associated column with a successive one of the bits in the string of bits and for writing the read out row of bits and the replaced bit back into the row.

15. A data access circuit in accordance with claim 14 further including means for checking the parity of the bits stored in each row of the memory array, means responsive to the checking means for counting the number of rows in which parity errors occur, and means responsive to the counting means for indicating a malfunction in the memory array at the time the number of rows containing parity errors exceed a predetermined threshold number.

* * * * *